United States Patent [19]
Kwak

[11] Patent Number: 5,739,716
[45] Date of Patent: Apr. 14, 1998

[54] PROGRAMMABLE ANALOG SWITCH

[75] Inventor: Duk Joo Kwak, Kyungki-Do, Rep. of Korea

[73] Assignee: LG Semicon Co., Ltd., Choongcheongbuk-Do, Rep. of Korea

[21] Appl. No.: 718,264

[22] Filed: Sep. 20, 1996

[30] Foreign Application Priority Data

Sep. 22, 1995 [KR] Rep. of Korea ............... 1995-31434

[51] Int. Cl.$^6$ ............................................. H03K 17/687
[52] U.S. Cl. ........................................ 327/427; 327/278
[58] Field of Search .................................. 327/51, 52, 107, 327/176, 208, 210–214, 269, 271, 266, 276, 278, 270, 28 H, 334, 335, 392, 394, 396, 399, 403, 404, 427

[56] References Cited

U.S. PATENT DOCUMENTS 4,899,071 2/1990 Morales .................... 327/277
5,332,916 7/1994 Hirai ........................ 257/369
5,592,116 1/1997 Bedouani ................. 327/278

*Primary Examiner*—Timothy P. Callahan
*Assistant Examiner*—My-Trang Nu Ton

[57] ABSTRACT

A programmable analog switch which is capable of varying a resistance value by controlling the number of turned-on transistors included in a resistance device according to a program, includes first and second transmission control units for logically operating externally applied control signals and generating transmission control signals, first and second variable resistance control units for varying the resistance encountered by an input analog signal in accordance with the control signals, and a transmission unit connected to the resistance device and an attenuated analog transmission gate for transmitting the attenuated analog signal to the analog transmission gate in accordance with the transmission control signals outputted from the first and second transmission control units.

4 Claims, 3 Drawing Sheets

5,739,716

1

PROGRAMMABLE ANALOG SWITCH

BACKGROUND OF THE INVENTION

1. Field of the Invention

The present invention relates to a programmable analog switch, and in particular, to an improved programmable analog switch which is capable of varying a resistance value of an analog switch according to the number of turned-on transistors included in a resistance device in accordance with a program control.

2. Description of the Prior Art

Conventionally, an analog switch could be embodied by using a standard cell, but recently a technique for varying a resistance value with a transistor gate array has been suggested.

As shown in FIG. 1, a conventional analog switch includes a resistance device for varying an impedance of an analog signal (Vin) inputted through an input pad in accordance with the number of transistors contained therein, an inverter (IN1) for inverting an externally applied gate voltage (Vc), an inverter (IN2) for inverting the output signal from the inverter (IN1), an analog transmission gate (SW1) for passing the output signal from the resistance device (RD) in accordance with the output signals from the inverters (IN1,IN2), and a charge offset device (CM) for offsetting an accumulated charge in accordance with the output signal from the inverters (IN1,IN2) or outputting an analog signal (Vout) outputted from the analog transmission gate (SW1) to the outside through an output pad.

The resistance device (RD) includes a plurality of PMOS pass transistors (P1~Pn) connected in series with each other and receiving a low voltage (Vss) at their gates, respectively, and a plurality of NMOS pass transistors (N1~Nn) connected in series with each other and connected in parallel with the PMOS transistors (P1~Pn) and receiving a supply voltage (VDD) at their gates, respectively. Here, the source of the PMOS transistor (P1) and the drain of the NMOS transistor (N1) receive the analog input signal (Vin), and the drain of the PMOS transistor (Pn) and the source of the NMOS transistor (Nn) are connected to the analog transmission gate (SW1).

The charge offset device (CM) includes a PMOS transistor and an NMOS transistor.

The operation of the conventional analog switch will now be described in detail.

The NMOS transistors (N1~Nn) inside the resistance device (RD) are turned on by the supply voltage (VDD) applied to their gates and the PMOS transistors (P1~Pn) inside the resistance device (RD) are turned on by the low voltage (Vss) applied to their gates. Therefore, the resistance device RD) exhibits a predetermined resistance value corresponding to the number of the transistors (N1~Nn) (P1~Pn) turned on therein.

Here, when the high-level gate voltage (Vc) is inputted to the inverter (IN1), a low-level signal is outputted from the inverter (IN1) and is inputted to the gate of the PMOS transistor included in the analog transmission gate (SW1), and a high-level signal is outputted from the inverter (IN2) and is inputted to the gate of the NMOS transistor included in the analog transmission gate (SW1). As a result, the analog transmission gate (SW1) is turned on.

Then, while the analog input signal (Vin) passes through the resistance device (RD), the analog signal (Vin) is attenuated in accordance with the resistance value of the resistance device, and is applied to the charge offset device (CM)

2 through the analog transmission gate. In accordance with the inputted signal, the charge offset device(CM) accumulates charge.

Here, the low-level signal outputted from the inverter (IN1) is inputted to the gate of the NMOS transistor included in the charge offset device (CM), and the high-level signal outputted from the inverter (IN2) is inputted to the gate of the PMOS transistor included in the charge offset device (CM). As a result, the charge offset device is turned off, which prevents the output signal from the analog transmission gate (SW1) from being outputted to the outside as the analog output signal (Vout).

Then, when a low-level gate voltage (Vc) is inputted to the inverter (IN1), the charge offset device (CM) is turned on, and the output signal from the analog transmission gate (SW1) corresponding to the accumulated charge is outputted as the analog output signal (Vout) to the outside. As a result, the charge accumulated in the charge offset device (CM) is offset.

As shown in FIG. 2, another conventional analog switch having the same construction as in FIG. 1, includes a resistance device (RD), inverters (IN1,IN2), an analog transmission gate (SW1) and a charge offset device (CM), and further includes an analog transmission gate (SW2) for applying the analog input signal (Vin) to the resistance device (RD) in accordance with the output signals from the inverters (IN1,IN2).

The analog transmission gate (SW2) includes a PMOS transistor having its gate connected for receiving the output signal from the inverter (IN1), and an NMOS transistor having its gate connected for receiving the output signal from the inverter (IN2).

When a high-level gate voltage (Vc) is inputted to the inverter (IN1), the inverter (IN1) outputs a low-level signal, and the inverter (IN2) outputs a high-level signal, whereby the analog transmission gate (SW2) is turned on and an analog signal (Vin) inputted through the input pad is applied to the resistance device (RD).

Further, when a low-level gate voltage (Vc) is inputted to the inverter (IN1), the analog transmission gate (SW2) is turned off, which cuts off the transmission of the analog signal (Vin).

The resistance device (RD), the analog transmission gate (SW1) and the charge offset device (CM) are operated the same as in FIG. 1.

However, since the conventional analog switch has a fixed number of turned-on transistors in each chip, the resistance value cannot be varied.

SUMMARY OF THE INVENTION

Accordingly, it is an object of the present invention to provide an improved programmable analog switch which is capable of varying a turned-on resistance value of a transistor included in a resistance device depending on a program.

To achieve the above object, the improvement for making a resistance value of the resistance device programmably variable in an improved programmable analog switch, wherein the analog switch includes first and second inverters connected in series for sequentially inverting an applied gate voltage, a first analog transmission gate for selectively transmitting an applied input signal in response to output signals from said first and second inverters, a resistance device connected to the first analog transmission gate, and a second analog transmission gate connected to the resistance device for selectively transmitting an output signal from the resistance device in response to the output signals from the first and second inverters, comprises transmission control units for logically operating upon applied control signals and generating transmission control signals in accordance therewith, variable resistance control units connected to the resistance device for controlling a resistance of the resistance device in accordance with the applied control signals and inverted versions of the applied control signals, and transmission units connected to the transmission control units, the resistance device and the second analog transmission gate, for transmitting an output signal of the resistance device to the second transmission gate in accordance with the transmission control signals from the transmission control units.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
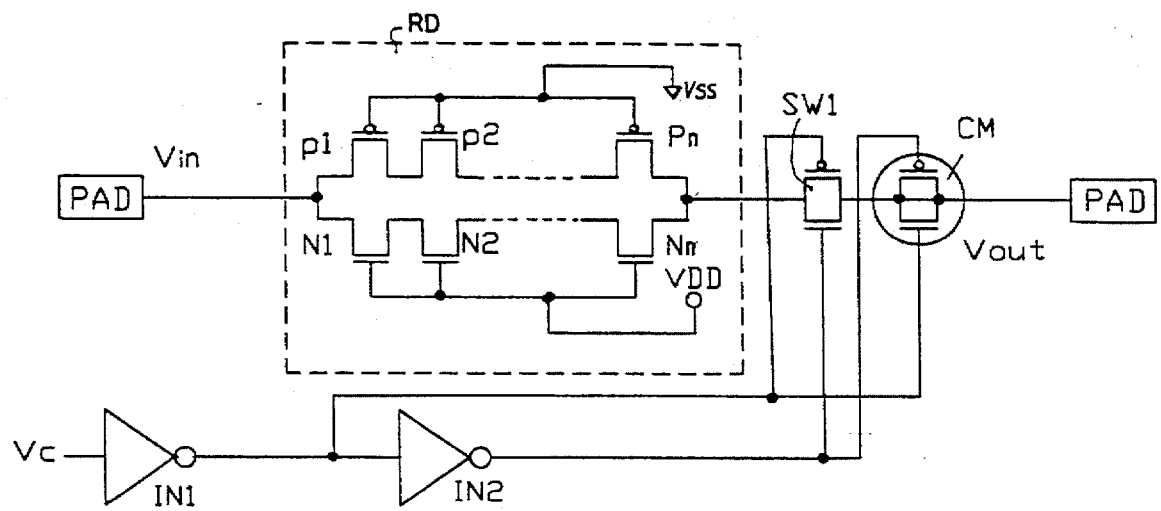
FIG. 1 is a circuit diagram of an analog switch according to the conventional art.
Figure 2:
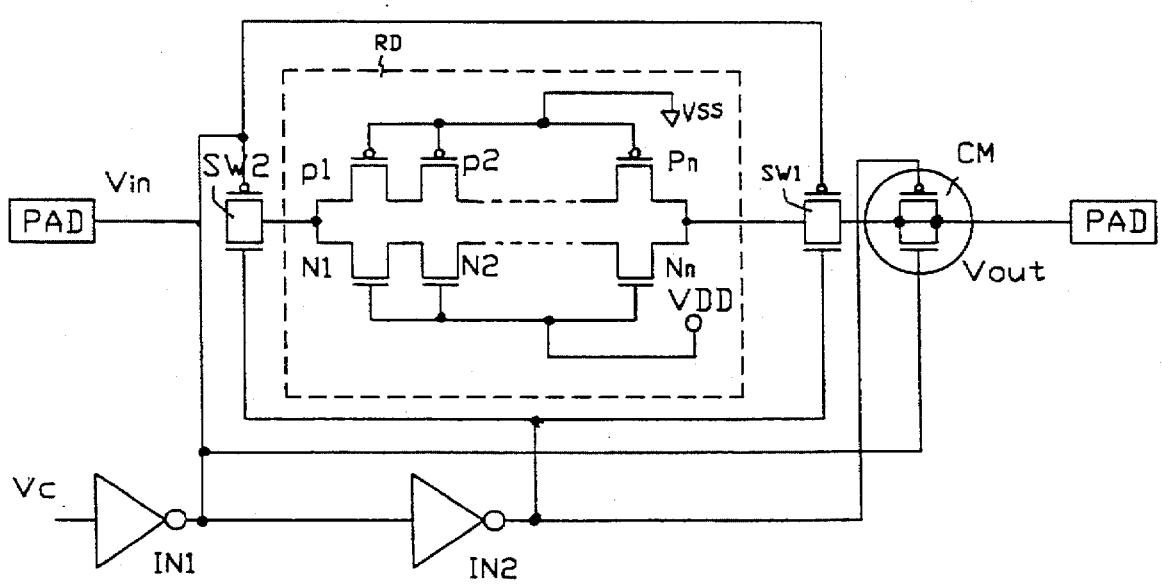
FIG. 2 is a circuit diagram of another analog switch according to the conventional art.
Figure 3:
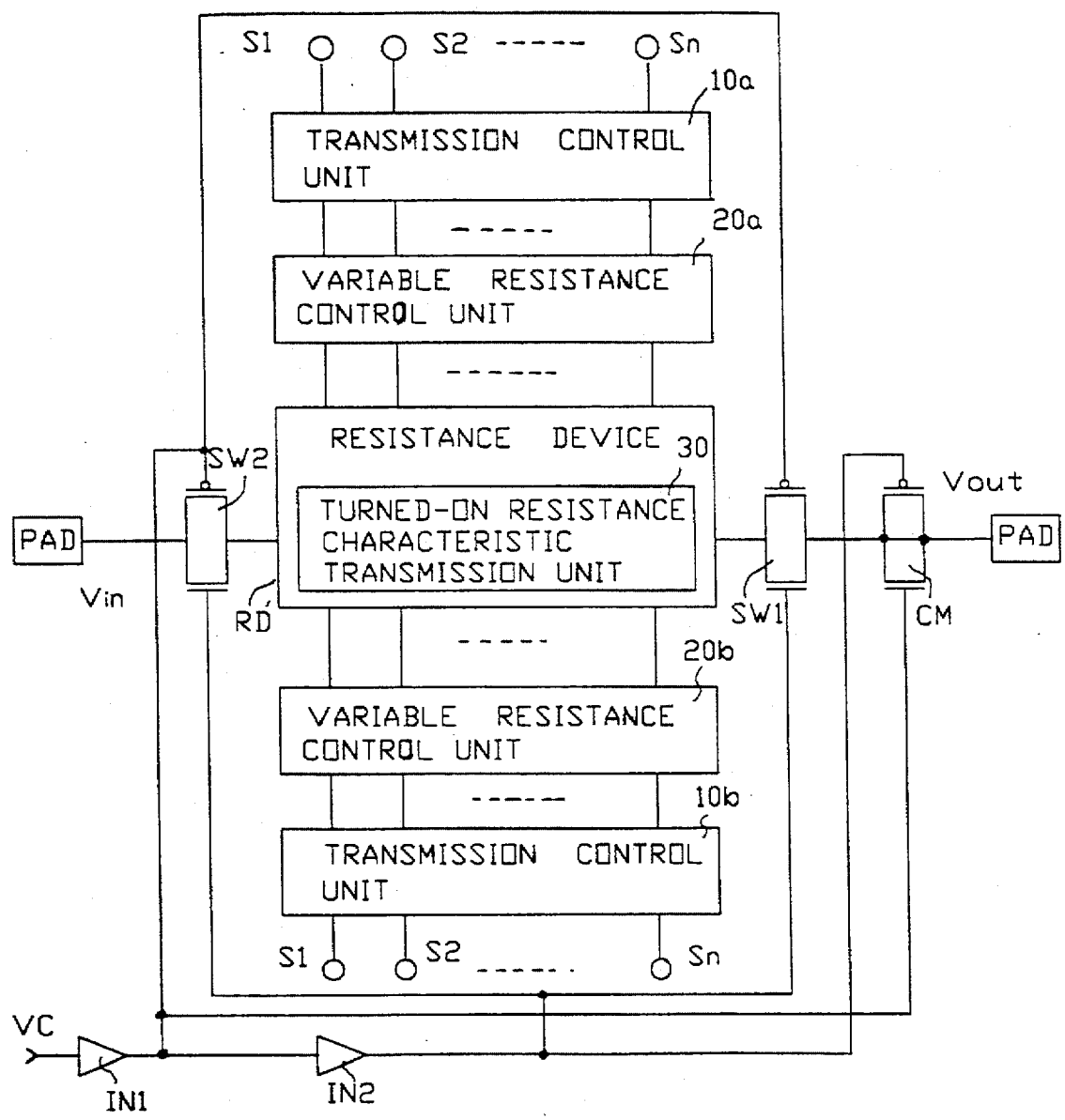
FIG. 3 is a block diagram of an analog switch according to the present invention.

As shown in FIG. 3, a programmable analog switch includes inverters (IN1,IN2) for sequentially inverting a gate voltage (Vc), an analog transmission gate (SW2) for transmitting an analog signal (Vin) inputted through an input pad in accordance with the output signals from the inverters (IN1,IN2), transmission control units 10a,10b for logically operating external control signals (S1~Sn) and generating transmission control signals, variable resistance control units 20a,20b for varying the attenuation of the analog input signal (Vin) in accordance with the control signals (S1~Sn), a resistance device (RD') connected to the analog transmission gate (SW2) and the variable resistance control units 20a,20b and including a turned-on resistance characteristic transmission unit 30 for transmitting the input analog signal and having a varied resistance characteristic in accordance with the control signals (S1~Sn) and the transmission control signals outputted from the transmission control units 10a,10b, an analog transmission gate (SW1) for passing an output signal from the resistance device (RD') in accordance with the output signals from the inverters (IN1,IN2) and a charge offset device (CM) for offsetting accumulated charge in accordance with the output signals from the inverters (IN1,IN2) or outputting the analog signal (Vout) outputted from the analog transmission gate (SW1) through the output pad to the outside.

Figure 4:
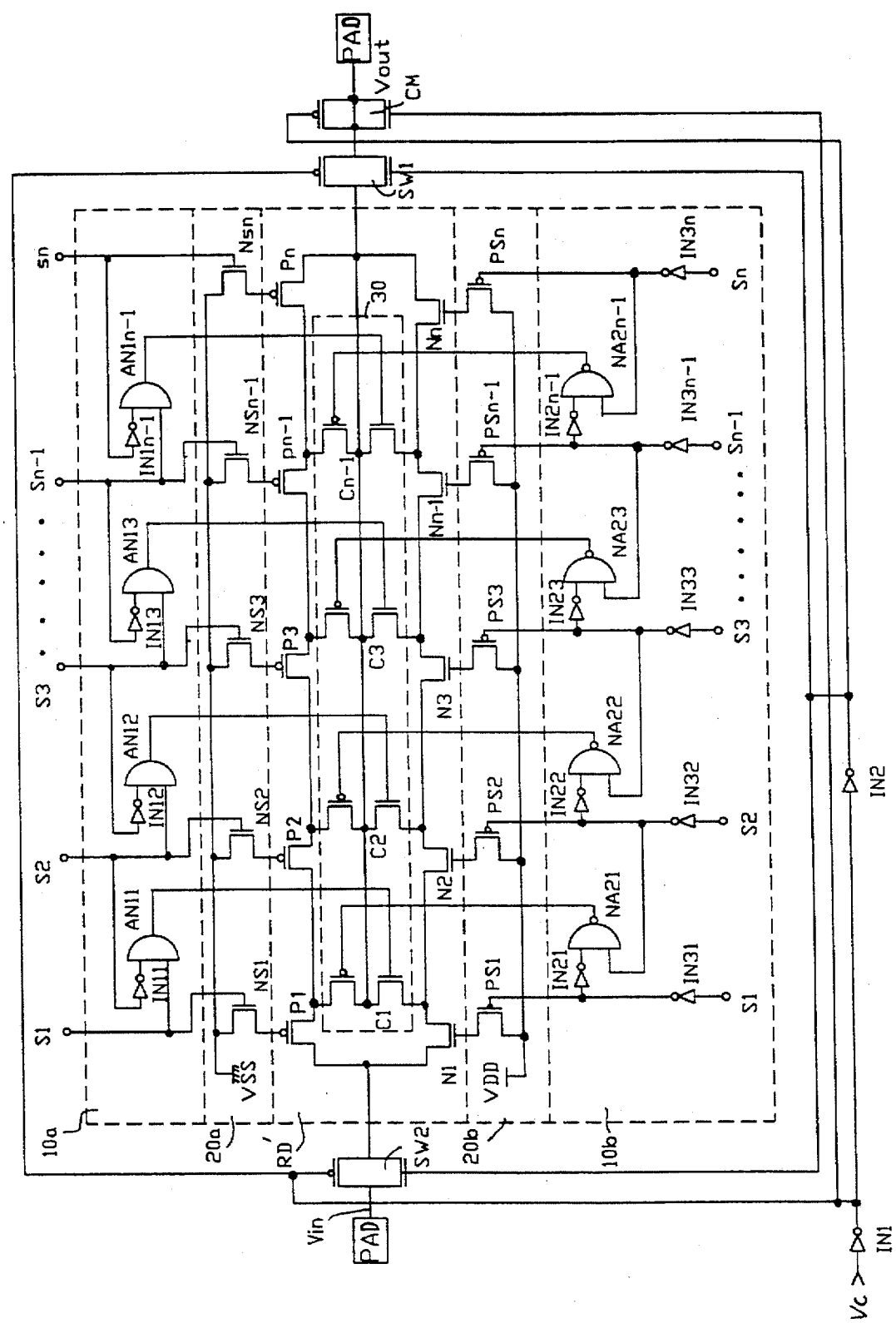
FIG. 4 is a detailed circuit diagram of an analog switch according to the present invention.

Referring to FIG. 4, the detailed circuit of the analog switch according to the present invention will now be described.

The transmission control unit 10a includes a plurality of inverters (IN11~IN1n−1) for inverting control signals (S2~Sn), respectively, and a plurality of AND gates (AN11~AN1n−1) for ANDing the output signals from the inverters (IN11~IN1n−1) and the control signals (S1~Sn−1).

The transmission control unit 10b includes a plurality of inverters (IN31~IN3n) for inverting control signals (S1~Sn), a plurality of inverters (IN21~IN2n−1) for inverting the output signals from the inverters (IN31~IN3n−1), and a plurality of NAND gates (NA21~NA2n−1) for NANDing the output signals from the inverters (IN21~IN2n−1, IN32~IN3n−1).

The variable resistance control unit 20a includes a plurality of NMOS transistors (NS1~NSn) connected in parallel with each other and each having a gate connected for receiving a low voltage (Vss).

The variable resistance control unit 20b includes a plurality of PMOS transistors (PS1~PSn) each having a gate connected for receiving the respective output signals from the inverters (IN31~IN3n) included in the transmission control unit 10b and having a source connected for receiving a supply voltage (VDD).

The resistance device (RD') includes a plurality of PMOS transistors (P1~Pn) connected in series with each other and having their gates respectively connected to the sources of the NMOS transistors (NS1~NSn) included in the variable resistance control unit 20a, a plurality of NMOS transistors (N1~Nn) connected in series with each other and having their gates respectively connected with the drains of the PMOS transistors (PS1~PSn) included in the variable resistance control unit 20b, and a transmission unit 30 connected with the source of each of the NMOS transistors (N1~Nn) and the drain of each of the PMOS transistors (P1~Pn).

Here, the source of the PMOS transistor (P1) and the drain of the NMOS transistor (N1) are commonly connected to the analog transmission gate (SW2), and the source of the PMOS transistor (Pn) and the drain of the NMOS transistor (Nn) are commonly connected to the analog transmission gate (SW1).

The transmission unit 30 further includes a plurality of CMOS transistor pairs (C1~Cn−1) the outputs of which are commonly connected to the analog transmission gate (SW1), respectively. Here, the sources of the PMOS transistors included in the CMOS transistor pairs (C1~Cn−1) are respectively connected to the drains of the PMOS transistors (P1~Pn−1) included in the resistance device (RD'), and the sources of the NMOS transistors included in the CMOS transistor pairs (C1~Cn−1) are respectively connected to the sources of the NMOS transistors (N1~Nn−1) included in the resistance device (RD'). In the transmission unit 30, transmission control signals outputted from the transmission control unit 10a are inputted from the gates of the NMOS transistors of the transistor pairs C1~Cn−1, and transmission controls signal outputted from the second transmission control unit 10b is inputted from the gates of the PMOS transistors of the transistor pairs C1~Cn−1.

Description will be given in detail of the operation and effect of the analog switch according to the present invention with reference to FIG. 4.

First, when a high level gate voltage (Vc) is inputted to the inverter (IN1), the inverter (IN1) outputs a low level signal, and this outputted low level signal is applied to the gates of the PMOS transistors included in the analog transmission gates (SW1,SW2). The inverter (IN2) inverts the output signal from the inverter (IN1) and outputs a high level signal, and this outputted high level signal is applied to the gates of the NMOS transistors included in the analog transmission gates (SW1,SW2).

Therefore, the analog transmission gates (SW1,SW2) are put in an operable condition, and the analog signal (Vin) is applied to the resistance device (RD') through the analog transmission gate (SW2).

Here, for example, when the control signal (S1) programmed as "1", and the control signals (S2~Sn) programmed as "0" are applied to the transmission control units 10a,10b and the variable resistance control unit 20a, respectively the NMOS transistor (NS1) in the variable resistance control unit 20a is turned on, and the NMOS transistors (NS2~NSn) thereof are turned off. Accordingly, the PMOS transistor (P1) in the resistance device (RD') is turned on by the low voltage (Vss) applied to its gate through the NMOS transistor NS1, and the other PMOS transistors (P2~Pn) are turned off.

The AND gate (AN11) of the transmission control unit 10a ANDs the control signal S1 and the inverted control signal /S2 and outputs a high level transmission control signal to the transmission unit 30 in the resistance device (RD'), and the AND gates (AN12~AN1n−1) of the transmission control unit 10b all output a low level transmission control signal to the transmission unit 30.

Here, the inverter (IN31) in the transmission control unit 10b outputs a low level signal to the variable resistance control unit 20b, and the inverters (IN32~IN3n−1) in the transmission control unit 10b all output a high level signal to the variable resistance control unit 20b. In addition, the NAND gate (NA21) in the transmission control unit 10b NANDs the twice-inverted control signal S1 and the inverted control signal /S2 and outputs a low level signal, and the NAND gates (NA22~NA2n−1) all output a high level signal to the transmission unit 30 in the resistance device (RD').

Therefore, the PMOS transistor (PS1) in the variable resistance control unit 20b receives the inverted control signal /S1 at its gate and is turned on, and the PMOS transistors (PS2~PSn) therein are all turned off. The NMOS transistor (N1) in the resistance device (RD') is turned on by the supply voltage (VDD) applied to its gate through transistor PS1, and the NMOS transistors (N2~Nn) therein are all turned off.

As a result, the CMOS transistor pair (C1) included in the transmission unit 30 in the resistance device (RD') is turned on by the signals from AND gate AN11 and NAND gate NA21, the other CMOS transistor pairs (C2~Cn−1) are turned off. The analog input signal (Vin) applied to the resistance device (RD') through the analog transmission gate (SW2) encounters the resistance due to the turned on PMOS transistor (P1) and the turned on NMOS transistor (N1) and the turned on transistor pair C1, and then is applied to the charge offset device (CM) through the analog transmission gate (SW1).

Here, when a low level gate voltage (Vc) is applied to the inverter (IN1), the inverter (IN1) outputs a high level signal and the inverter (IN2) outputs a low level signal. Accordingly, a PMOS transistors and an NMOS transistors included in the charge offset device (CM) are turned on, and then the analog signal (Vout) which has been attenuated by the resistance of the PMOS transistor (P1) and the NMOS transistor (N1) included in the resistance device (RD') is outputted to the outside through the output pad.

For example, when the control signals (S1,S2) are programmed as "1", and the control signals (S3~Sn) are programmed as "0", according to the above-mentioned procedure, the transmission control units 10a,10b and the variable resistance control units 20a,20b can be made operable.

Consequently, the PMOS transistors (P1,P2) and the NMOS transistors (N1,N2) included in the resistance device (RD') are turned on, and the CMOS transistor pair (C2) included in the transmission unit 30 in the resistance device (RD') is turned on.

As a result, an analog signal (Vout) is attenuated due to the resistance of the PMOS transistors (P1,P2) and the NMOS transistors (N1,N2) included in the resistance device (RD') and is outputted to the outside through the output pad.

In the above-described operation, as the values of the control signals (S1~Sn) are sequentially varied from "10 . . . 00" to "11 . . . 10", the PMOS transistors (P1~Pn−1) and the NMOS transistors (N1~Nn−1) included in the resistance device (RD') are sequentially turned on, and the CMOS transistor pairs (C1~Cn−1) included in the transmission unit 30 in the resistance device (RD') are also sequentially turned on. When the values of the control signals S1~Sn are "11 . . . 11", then all of the transistors P1~Pn and N1~Nn in the resistance device RD' are turned on, providing the maximum resistance characteristic, and the attenuated analog signal is passed from the transistors Pn,Nn to the transmission gate SW1. Thus, an analog signal (Vout) having a different attenuation characteristic in accordance with the values of the programmed control signals (S1~Sn), can be outputted.

As described in detail above, since the user can arbitrarily vary the resistance characteristic inside the analog switch, a novel and useful analog switch which has a variety of programmable resistance characteristics be realized.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. In an analog switch including first and second inverters connected in series for sequentially inverting an applied gate voltage, a first analog transmission gate for selectively transmitting an applied input signal in response to output signals from said first and second inverters, a resistance device connected to the first analog transmission gate, and a second analog transmission gate connected to the resistance device for selectively transmitting an output signal from the resistance device in response to the output signals from the first and second inverters, the improvement for making a resistance value of the resistance device programmably variable, comprising:

transmission control means for logically operating upon applied control signals and generating transmission control signals in accordance therewith;

variable resistance control means connected to the resistance device for controlling a resistance of the resistance device in accordance with the applied control signals and inverted versions of the applied control signals; and transmission means connected to the transmission control means, the resistance device and the second analog transmission gate, for transmitting an output signal of the resistance device to the second transmission gate in accordance with the transmission control signals from the transmission control means.

2. The improved analog switch of claim 1, wherein the transmission control means comprises:

first transmission control unit means for receiving a plurality of control signals S1~Sn, for applying the control signals S1~Sn to the variable resistance control means, and for ANDing respective ones S1~Sn−1 of the control signals with respective inverted ones /S2~/Sn−1 of the control signals and for applying the respective ANDed results as transmission control signals to the transmission means; and second transmission control unit means for receiving and inverting the plurality of control signals S1~Sn, for applying the inverted control signals /S1~/Sn to the variable resistance control means, and for inverting and NANDing respective ones /S1~/Sn−1 of the inverted control signals with respective ones /S2~/Sn of the inverted control signals and for applying the respective NANDed results as transmission control signals to the transmission means.

3. The improved analog switch of claim 1, wherein the resistance device is comprised of a plurality of PMOS resistance transistors connected in series between the first and second analog transmission gates and a plurality of NMOS resistance transistors connected in series between the first and second analog transmission gates and in parallel with the series-connected plurality of PMOS resistance transistors, and wherein the variable resistance control means comprises:

a plurality of NMOS control transistors each having a gate for receiving a corresponding one of the applied control signals, a drain connected to voltage ground and a source connected to a gate of a corresponding one of the plurality of PMOS resistance transistors of the resistance device; and a plurality of PMOS control transistors each having a gate for receiving a corresponding inverted one of the applied control signals, a source connected to a power supply voltage and a drain connected to a gate of a corresponding one of the plurality of NMOS resistance transistors of the resistance device.

4. The improved analog switch of claim 1, wherein the resistance device is comprised of a plurality of PMOS resistance transistors P1~Pn connected in series between the first and second analog transmission gates and a plurality of NMOS resistance transistors N1~Nn connected in series between the first and second analog transmission gates and in parallel with the series-connected plurality of PMOS resistance transistors, and wherein the transmission means comprises:

a plurality n−1 of complementary pairs of a PMOS transmission transistor and an NMOS transmission transistor operable in response to transmision control signals from the transmission control means and connected between respective ones of the PMOS resistance transistors P1~Pn−1 and the NMOS resistance transistors N1~Nn−1 of the resistance device and the second analog transmission gate, each PMOS transmission transistor receiving at a gate thereof one of the transmission control signals from the transmission control means and having a source connected to a drain of a corresponding one of the PMOS transistors P1~Pn−1 of the resistance device and each NMOS transmission transistor receiving at a gate thereof one of the transmission control signals from the transmission control means and having a drain connected to a drain of its complementary PMOS transmission transistor and to the second analog transmission gate and a source connected to a corresponding one of the NMOS transistors N1~Nn−1 of the resistance device.

* * * * *